(12) United States Patent
Taniguchi et al.

(10) Patent No.: US 8,951,698 B2
(45) Date of Patent: Feb. 10, 2015

(54) METHOD FOR FORMING PATTERN AND METHOD FOR PRODUCING ORIGINAL LITHOGRAPHY MASK

(71) Applicant: Kabushiki Kaisha Toshiba, Tokyo (JP)

(72) Inventors: Rikiya Taniguchi, Tokyo (JP); Hideaki Sakurai, Kanagawa (JP); Shinichi Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 13/784,654

(22) Filed: Mar. 4, 2013

(65) Prior Publication Data
US 2014/0087291 A1     Mar. 27, 2014

(30) Foreign Application Priority Data
Sep. 27, 2012   (JP) ................. P2012-213815

(51) Int. Cl.
*G03F 1/70*     (2012.01)
(52) U.S. Cl.
CPC ........................ *G03F 1/70* (2013.01)
USPC .................... 430/5; 430/22; 430/30; 430/330

(58) Field of Classification Search
CPC ........................................................ G03F 1/70
USPC ........................................ 430/5, 22, 30, 330
See application file for complete search history.

(56) References Cited

U.S. PATENT DOCUMENTS
6,565,763 B1 *   5/2003   Asakawa et al. ................ 216/56

FOREIGN PATENT DOCUMENTS
JP     2011077475 A     4/2011

* cited by examiner

*Primary Examiner* — Christopher Young
(74) *Attorney, Agent, or Firm* — Patterson & Sheridan LLP.

(57) ABSTRACT

A method forming a pattern includes a process in which self-assembly material is formed on the substrate where on which a fiducial mark is formed, and the self-assembly material is separated in micro phase to form a self-assembled pattern. The position error from a predetermined formation position of the self-assembled pattern is measured on the basis of the fiducial mark, and a pattern for an alignment as well as a peripheral circuit pattern are formed on the substrate. The formation position of at least one pattern among the pattern for alignment and peripheral circuit pattern is corrected using the position error.

21 Claims, 5 Drawing Sheets

METHOD FOR FORMING PATTERN AND METHOD FOR PRODUCING ORIGINAL LITHOGRAPHY MASK

CROSS-REFERENCE TO RELATED APPLICATION

This application is based upon and claims the benefit of priority from Japanese Patent Application No. 2012-213815, filed Sep. 27, 2012; the entire contents of which are incorporated herein by reference.

FIELD

Embodiments described herein relate to the method for forming pattern and the method for producing original lithography mask.

BACKGROUND

Conventional lithography technology in the production of semiconductor devices includes double patterning technology with ArF immersion exposure, EUV lithography, and nano-imprint. In the conventional lithography technology, there are many problems associated with pattern miniaturization, such as increases in cost, a decrease in position accuracy of the pattern, and a decrease in throughput.

The application of directed self-assembly (DSA) methods to lithography technology is expected. DSA provides self-assembled phases of material generated by stable energy and therefore a pattern with high dimensional accuracy can be created. In particular, DSA provides a microphase separation of a macromolecule block copolymer that forms a periodic structure of various formations of several nanometers (nm) to several hundred nm wide by a simple coating and annealing process. The structure of the microphase material is changed into the various formations, such as spherical formations, pillar-shaped formations and a linear (layered) shape according to the composition ratio of the block copolymer. Hole, pillar, and the line patterns can be formed in various dimensions according to the molecular weight of the block copolymer, by selectively removing portions of the reacted copolymer in regions to create an etch mask from the reacted copolymer.

However, application of DSA to lithography techniques sometimes produces errors in the position of the patterns.

DETAILED DESCRIPTION

According to the embodiments, a method for forming a pattern and a method for producing an original mask with reduced errors in the relative positions of a self-assembled pattern and other patterns is provided.

In general, one embodiment of the invention is explained based on the drawings as follows.

According to one embodiment, a method of forming a pattern or mask is provided with a process of forming a self-assembly material on a substrate having a fiducial (reference) mark formed thereon. The method also includes a process of forming a self-assembled pattern, where the self-assembly material is micro phase separated. The method also includes a process of measuring a position error from a fixed position where the self-assembled pattern is formed based on the fiducial mark. The method also includes a process of forming a pattern for alignment and a pattern of a peripheral circuit, on the substrate. The formation position of at least one of the pattern for alignment and pattern of the peripheral circuit is corrected by using the position error.

FIG. 1A to FIG. 12B are drawings that explain the method for forming the pattern according to one embodiment.

Figure 1A:
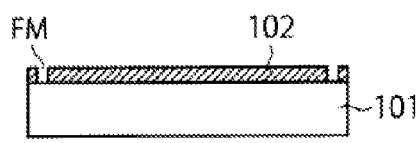
FIGS. 1A and 1B are a sectional view and a top view, respectively, for illustrating a method of forming a pattern according to one embodiment.
Figure 1B:
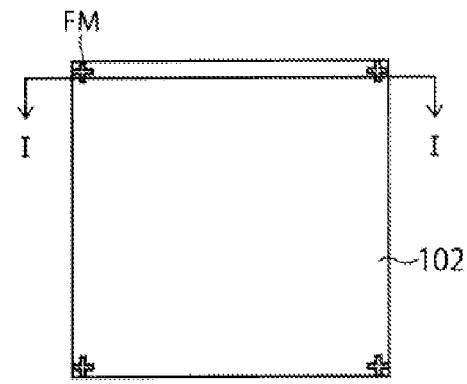

As shown in FIG. 1A and FIG. 1B, a photo mask substrate is prepared having a shading film 102 (mask film) formed on a glass or quartz substrate 101. FIG. 1B is a top view, and FIG. 1A is a sectional view along the I-I line in FIG. 1B. The shading film 102 is a film that contains chromium and tantalum. A fiducial mark FM (used subsequently at the time of measuring the position of the pattern) is formed on this photo mask substrate in the shading or mask film 102. The fiducial mark FM can be formed on the shading film 102 as well as on the glass substrate 101.

Figure 2A:
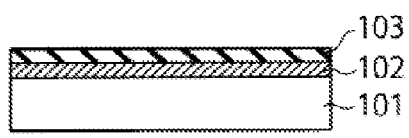
FIGS. 2A and 2B are a sectional view and a top view, respectively, for illustrating the process following FIGS. 1A and 1B.
Figure 2B:
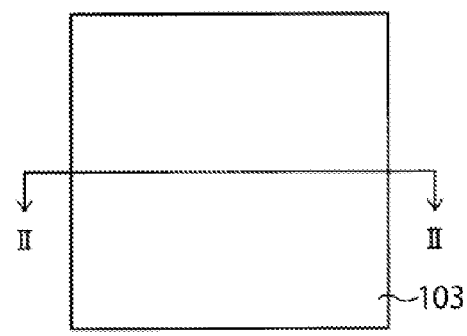

As shown in FIG. 2A and FIG. 2B, an underlayer 103 is formed on the photo mask substrate over the shading film 102, including the fiducial marks. FIG. 2B is a top view, and FIG. 2A is a sectional view along the II-II line in FIG. 2B, of the substrate 101, shading film 102 and underlayer 103. The underlayer 103 becomes the base of the block copolymer formed in the following process. The surface state of the area where light of a fixed wave length is irradiated changes into the underlayer 103. For instance, the underlayer 103 has hydrophobic properties before exposure to irradiating light, and the area where light is irradiated on the underfilm 103 changes to have hydrophilic properties.

A laminated film of a self-assembled monomolecular film layer and a polymer layer can be used as the underlayer 103. A silane coupling agent which contains a benzophenone skeleton can be used for the self-assembled monomolecular film layer. Moreover, an acrylic resin derivative (meth) can be used for the polymer. In the light irradiation area of self-assembled monomolecular film layer and the polymer laminated structure, since the cross-linkage is caused in the portion of the polymer which comes in contact with the benzophenone structure, the surface is derived from the polymer. As a polymer, a hydrophilic resin such as (meth)acrylic resin is used and an optical irradiation part can be in the hydrophilic state.

Figure 3A:
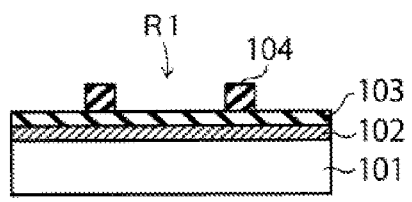
FIGS. 3A and 3B are a sectional view and a top view, respectively, for illustrating the process following FIGS. 2A and 2B.
Figure 3B:
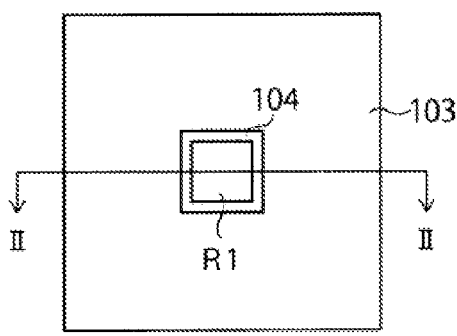

As shown in FIG. 3A and FIG. 3B, a resist is applied on the underlayer 103, and exposed and developed to form a frame pattern 104 which encloses area R1. FIG. 3B is a top view of the substrate 103 and the frame and FIG. 3A is a sectional view along the II-II line of FIG. 3B. The area R1 within the frame is an area where a block copolymer is formed in subsequent processes to form pattern mask for a memory cell. Although area R1 is an area corresponding to the a pattern of a memory cell, if it is a pattern area formed in a pitch of equal intervals, area R1 is not an area limited to the memory cell.

The resist, which is a material of the frame pattern 104, has the neutral characteristics for the two polymers (first polymer and the second polymer), which are included in the block copolymer formed in the following process. That is, the resist has a surface energy between the surface energy of the first polymer and the surface energy of the second polymer.

Figure 4A:
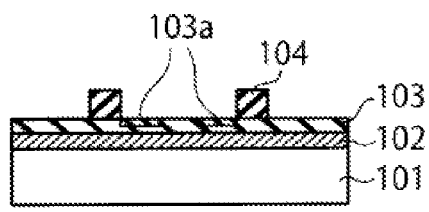
FIGS. 4A and 4B are a sectional view and a top view, respectively, for illustrating the process following FIGS. 3A and 3B.
Figure 4B:
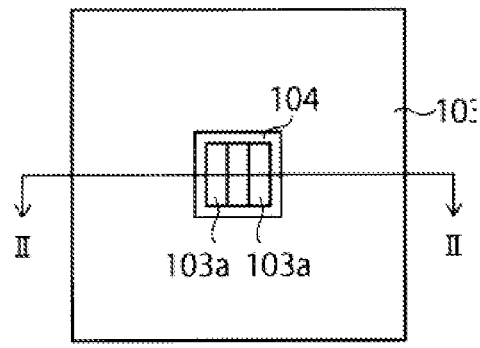

As shown in FIG. 4A and FIG. 4B, the fixed area of underlayer 103 is exposed to light through a mask (not shown in the figure). FIG. 4B is a top view of the exposed underlayer and FIG. 4A is a sectional view along the II-II line in FIG. 4B. The irradiating light is light of a wave length for exposing the underlayer 103. For instance, a light from UV to DUV wavelength (365 nm, 248 nm, and 193 nm) may be used. An exposed part 103a (first portion) of the underlayer 103 changes into hydrophilic properties and the unexposed part (second portion) covered by the mask retains hydrophobic properties. For instance, as shown in FIG. 4A and FIG. 4B, the underlayer 103 is exposed in lines having a fixed pitch in the area R1 (shown in FIGS. 3A and 3B) enclosed by the frame pattern 104. As a result, when the block copolymer formed in the following process is micro phase separated, the underlayer 103 of area R1 enclosed by the frame pattern 104 becomes a chemical guide layer which controls the position where the micro phase-separated pattern is formed.

Figure 5A:
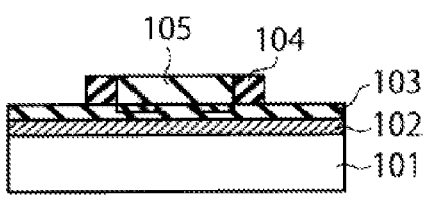
FIGS. 5A and 5B are a sectional view and a top view, respectively, for illustrating the process following FIGS. 4A and 4B.
Figure 5B:
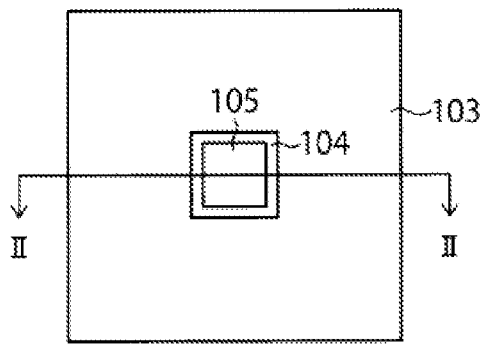

As shown in FIG. 5A and FIG. 5B, a block copolymer layer 105 is formed on the underlayer 103 within the boundary of the frame pattern 104. FIG. 5B is a top view and FIG. 5A is a sectional view along the II-II line in FIG. 5B of the substrate 103 having the block copolymer formed therein. A di-block copolymer, in which a first polymer block chain and a second polymer block chain are included, is used as the block copolymer. The block copolymer of polystyrene (PS) and polymethyl methacrylate (PMMA) can be used as the di-block copolymer. Due to the frame pattern 104, the block copolymer can be contained by the frame pattern 104 and thereby prevent leakage outside of the frame pattern 104.

Figure 6A:
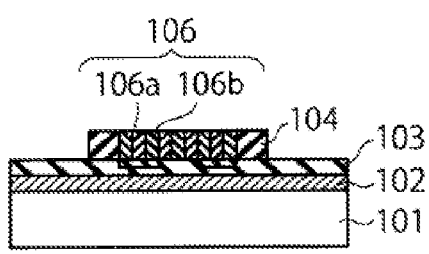
FIGS. 6A and 6B are a sectional view and a top view, respectively, for illustrating the process following FIGS. 5A and 5B.
Figure 6B:
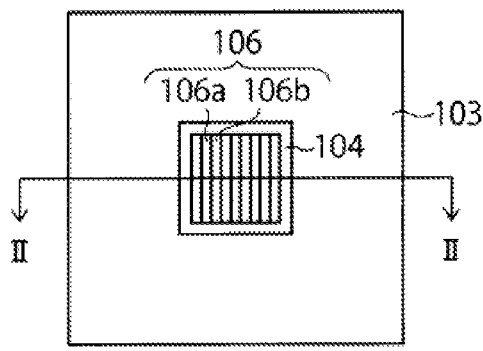

Heat is then applied to the substrate 103 with a heat source such as a hot plate to the block copolymer to separate the block copolymer into regions 106a, 106b as shown in FIG. 6A and FIG. 6B. As a result, the block copolymer layer 105 is separated in micro phase, and a lamellar self-assembled pattern 106 is formed. FIG. 6B is a top view and FIG. 6A is a sectional view along the II-II line in FIG. 6B of the substrate 101 and separated block copolymer 106. A laminated first polymer 106a containing the first polymer block chain and a laminated second polymer 106b containing the second polymer block chain are alternately arranged in the self-assembled micro phase pattern.

The first portion 103a (where the surface state changes by exposure to light) and the underlayer 103 which has the second portion (where the surface state is not changed) form a chemical guide layer and thus, the lamellar self-assembled pattern 106 is formed with the underlayer as a guiding pattern. Moreover, as mentioned above, the frame pattern 104 can control the influence on the array of self-assembled pattern 106 because it has the neutral characteristics for the first polymer and the second polymer.

The position where the self-assembled pattern 106 is formed is measured based on the fiducial mark FM (shown in FIG. 1). For instance, a SEM is used for the measurement. A position error of the measurement position and a target position is calculated. The barycentric coordinate position is measured and a position error of a target position is calculated for the first polymer 106a; and the second polymer 106b of the lamellar self-assembled pattern 106. Moreover, a position error for the entire self-assembled pattern 106 is calculated from the position error of each pattern (the first polymer 106a and the second polymer 106b).

Figure 7A:
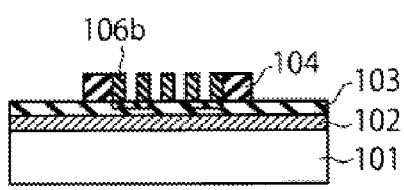
FIGS. 7A and 7B are a sectional view and a top view, respectively, for illustrating the process following FIGS. 6A and 6B.
Figure 7B:
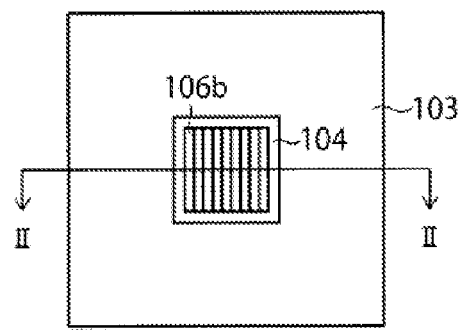

As shown in FIG. 7A and FIG. 7B, one of the first polymer 106a and the second polymer 106b is selectively removed in the self-assembled pattern 106 by a processing procedure, such as by application of a developer or a solvent that selectively removes one of the first polymer 106a and the second polymer 106b. The first polymer 106a is removed here as shown. FIG. 7B is a top view and FIG. 7A is a sectional view along the II-II line in FIG. 7B of the substrate 103 having the first polymer layer 106a selectively removed.

Figure 8A:
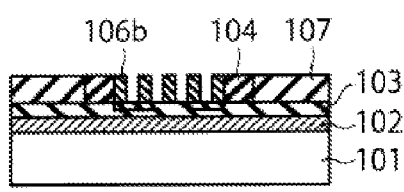
FIGS. 8A and 8B are a sectional view and a top view, respectively, for illustrating the process following FIGS. 7A and 7B.
Figure 8B:
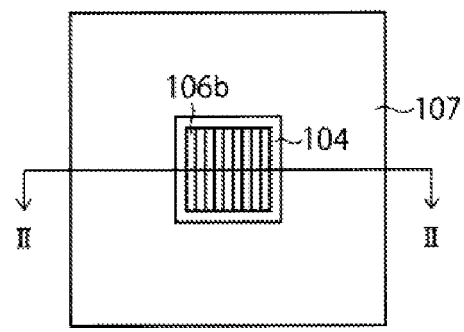

As shown in FIG. 8A and FIG. 8B, a resist 107 is applied on the underlayer 103 which is outside of the perimeter of the frame pattern 104. FIG. 8B is a top view of the substrate 102 and resist layer 107 and FIG. 8A is a sectional view of the substrate along the II-II line in FIG. 8B.

Figure 9A:
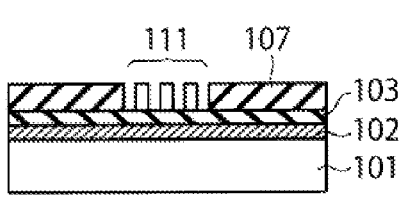
FIGS. 9A and 9B are a sectional view and a top view, respectively, for illustrating the process following FIGS. 8A and 8B.
Figure 9B:
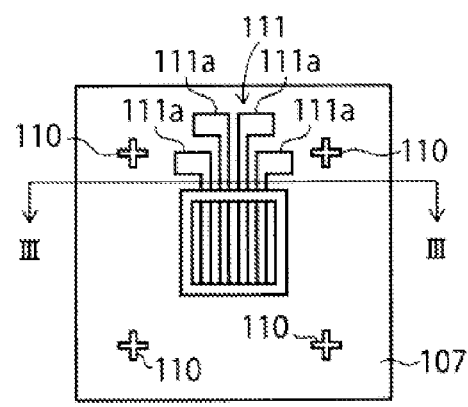

As shown in FIG. 9A and FIG. 9B, the resist is exposed and developed and a pattern 110 (for alignment) and a peripheral circuit pattern 111 are formed in the resist 107. For instance, an electron beam is used for exposure of the resist 107. FIG. 9B is a top view and FIG. 9A is a sectional view along the III-III line in FIG. 9B of the substrate 102 and patterned resist 107. For a precise alignment of the pattern 110 and the surrounding circuit pattern 111, the formation position is corrected so that the relative positional relation with the self-assembled pattern 106 may get closer to the design value.

The position error calculated for the entire self-assembly pattern 106 is added to a first formation position (exposure position according to design information) for the pattern 110 for alignment, and the formation position is corrected.

Moreover, as shown in FIGS. 3A and 3B, the area R1 corresponds to a memory cell area and the peripheral circuit pattern 111 corresponds to and aligns with the connection portions of the memory cell, i.e., the removed portions of the polymer 106a. As shown in FIGS. 9A and 9B, the peripheral circuit pattern 111 includes a pattern 111a in multiple numbers which are aligned with positions of the removed first polymer 106a (shown in FIGS. 6A and 6B) respectively. In this case, the position error of the corresponding first polymer 106a is added to the first position (exposure position according to design information) where each pattern 111a is formed and the formation position is corrected. That is, the formation position of each pattern 111a is corrected for the peripheral circuit pattern 111.

Figure 10A:
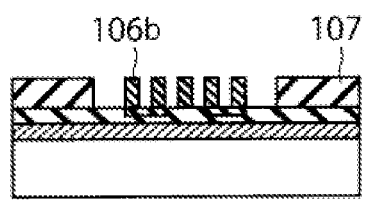
FIGS. 10A and 10B are a sectional view and a top view, respectively, for illustrating the process following FIGS. 9A and 9B.
Figure 10B:
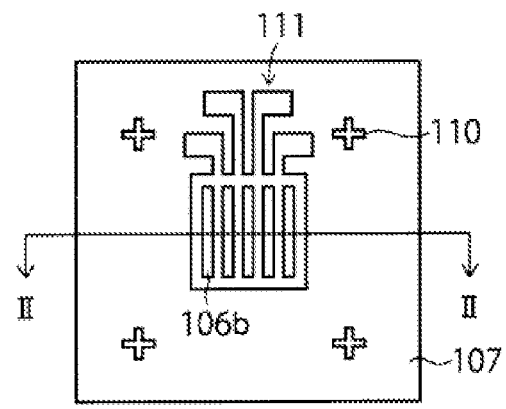

As shown in FIG. 10A and FIG. 10B, the frame pattern 104 is selectively removed. FIG. 10B is a top view and FIG. 10A is a sectional view along the II-II line in FIG. 10B of the substrate 102 showing the frame pattern removed therefrom.

Figure 11A:
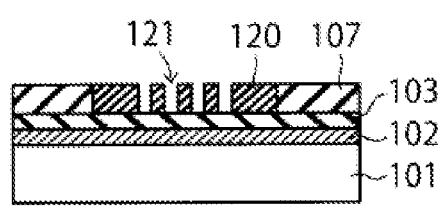
FIGS. 11A and 11B are a sectional view and a top view, respectively, for illustrating the process following FIGS. 10A and 10B.
Figure 11B:
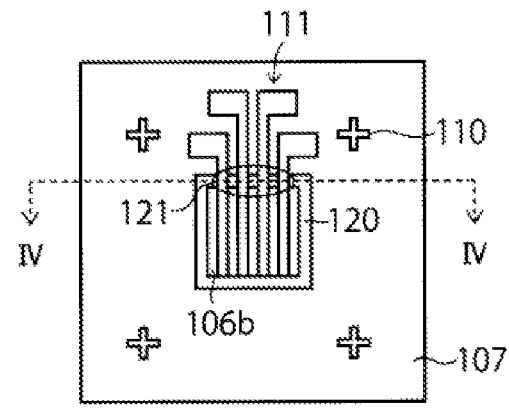

As shown in FIG. 11A and FIG. 11B, a resist 120 is applied on the area where the frame pattern 104 is removed, and the resist is exposed and developed. FIG. 11B is a top view and FIG. 11A is a sectional view along the IV-IV line in FIG. 11B of the substrate 102. A connection pattern 121 in which the first polymer 106a of the self-assembly pattern 106 and the pattern 111a of corresponding peripheral circuit pattern 111 are connected, is formed in the resist 120.

Figure 12A:
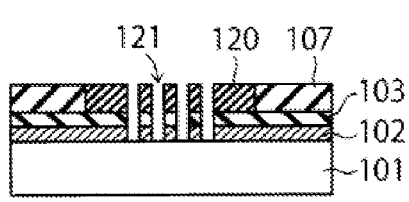
FIGS. 12A and 12B are a sectional view and a top view, respectively, for illustrating the process following FIGS. 11A and 11B.
Figure 12B:
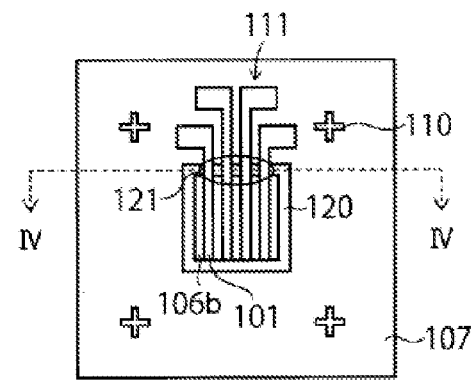

As shown in FIG. 12A and FIG. 12B, the resist 107, resist 120 and the second polymer 106b are used as a mask, and the underlayer 103 and shading film 102 are etched. FIG. 12B is the top view and FIG. 12A is a sectional view along the IV-IV line in FIG. 12B.

Figure 13A:
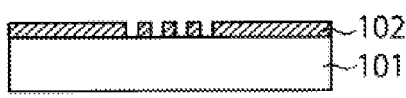
FIGS. 13A and 13B are a sectional view and a top view, respectively, for illustrating the process following FIGS. 12A and 12B.
Figure 13B:
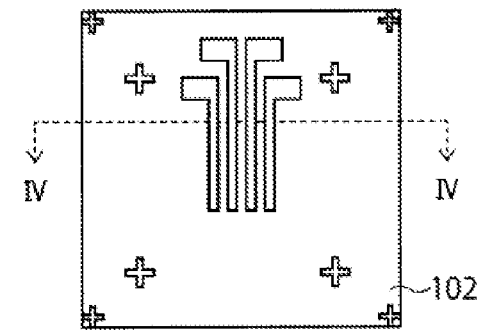

The resist 107, the resist 120, the second polymer 106b and the underlayer 103 are then removed as shown in FIG. 13A and FIG. 13B. FIG. 13B is the top view and FIG. 13A is a sectional view along the IV-IV line in FIG. 13B. As a result, the first polymer 106a of the self-assembly pattern 106, the pattern 110 for alignment, the peripheral circuit pattern 111 and a connection pattern 121 are transcribed to the shading (mask) film 102 on the glass or quartz substrate 101 and a photo mask substrate (for original lithograph) is obtained.

For the precise alignment pattern 110 and the surrounding circuit pattern 111, the difference in the position during formation of the self-assembly pattern 106 is considered and the formation position is corrected. Therefore, the position errors of the self-assembly pattern 106, the alignment or fiducial mark pattern 110 for alignment and the peripheral circuit pattern 111 can be reduced.

Thus, according to this embodiment, even when there is a difference in position on the formation of the self-assembly pattern, the error in a relative positional relation between the self-assembly pattern and other patterns can be reduced.

In the embodiment, the position where the self-assembly pattern 106 is formed, is measured, and the position error of relative to a target position is calculated. However, the position where the second polymer 106b is formed can be measured and the position error relative to the target position can be calculated after removing the first polymer 106a of the self-assembly pattern 106. Moreover, the position where the first removed polymer 106a is formed can be measured and the position error relative to the target position can be calculated.

Moreover, after forming of the peripheral circuit pattern 111, the position where the peripheral circuit pattern 111 is formed, can be measured, the position error of the target position can be calculated and the position (exposure position) where the connection pattern 121 is formed, can be corrected.

The lithographic exposure is not limited to the electron beam. EUV light, UV light, ion beam, X rays, visible radiation, and infrared light can also be used. Moreover, the frame pattern 104, the pattern 110 for alignment, the peripheral circuit pattern 111, and the connection pattern 121 can be created by an imprint process.

In the embodiment, the shading film 102 with the first polymer 106a of self-assembly pattern 106, the pattern 110 for alignment, the peripheral circuit pattern 111 and the transcribed connection pattern 121 are used as a mask and the glass substrate 101 is processed. The template for imprint can be made.

In the embodiment, although the position where the pattern 110 for alignment and the peripheral circuit pattern 111 are formed is corrected, the position where only either pattern is formed can be corrected as well. Moreover, when there is position error in the formation position and target position of the self-assembly pattern 106 is within a fixed range, the position where the pattern 110 for the alignment and/or the peripheral circuit pattern 111 is formed cannot be corrected.

In the embodiment, the connection pattern 121 can be formed by using the micro phase separation of the self-assembly material. For instance, the self-assembly material which contains the second polymer 106b of the self-assembled pattern 106, and the polymer having large affinity with the surface of the resist 107, is used, and the self-assembly pattern corresponding to the connection pattern 121 is formed. Moreover, the self-assembly material which contains the second polymer 106b of the self-assembled pattern 106, and the polymer having the large affinity with the surface after re-forming the surface state of the resist 107, can also be used. Moreover, the chemical guide layer which corresponds to the connection pattern 121 is formed in the area where the frame pattern 104 is removed; the self-assembly material can be applied on the chemical guide layer. The self-assembly material is separated in micro phase according to the second polymer 106b and the resist 107. Therefore, even if the position of the first polymer 106a or the peripheral circuit pattern 111 is moved, the connection pattern 121 in which the first polymer 106a and the peripheral circuit pattern 111 are connected can still be formed.

In the embodiment, although the chemical guide layer is formed in the frame pattern 104, when the block copolymer layer 105 is separated in micro phase by using the frame pattern 104 as a physical guide and the self-assembly pattern 106 is obtained, the chemical guide layer can be omitted. In that case, the frame pattern 104 contains any one of the polymer among two polymers included in the block copolymer layer 105 and the material having the large affinity.

In the embodiment, the example of forming the lamellar self-assembled pattern 106 is explained, however, other shapes such as cylindrical is also acceptable.

The glass substrate is used as the processed substrate in the embodiment. The glass substrate may be a fused silica substrate and a sapphire glass substrate. Moreover, the substrate which constitutes the original mask for EUV lithography, character aperture for EB, optical imprint and original thermal imprint, can also be used for the processed substrate.

While certain embodiments have been described, these embodiments have been presented as examples only, and are not intended to limit the scope of the inventions. In fact, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for forming a pattern, comprising:
    forming a self-assembly material containing a first polymer portion and a second polymer portion on a substrate having a fiducial mark; and
    heating the self-assembly material to form a first pattern;
    measuring a position error of the first pattern on the basis of the fiducial mark; and
    forming a second pattern on the substrate based on the position error.

2. The method of claim 1, further comprising:
    forming a frame pattern on the substrate, wherein a chemical guide layer is formed inside the frame pattern, and the self-assembly material is formed on the chemical guide layer.

3. The method of claim 2, wherein the first polymer portion is hydrophobic and the second polymer portion is hydrophilic, and the frame pattern comprises a surface tension that is between the first polymer portion and the second polymer portion.

4. The method of claim 1, wherein the first pattern comprises a first part aligned with the first polymer portion and a second part aligned with the second polymer portion.

5. The method of claim 4, wherein the first polymer portion is hydrophobic and the second polymer portion is hydrophilic, and the frame pattern comprises a surface tension that is between the first polymer portion and the second polymer portion.

6. The method of claim 5, wherein one of the first part or the second part is selectively removed to provide a plurality of first portions comprising one of the first polymer portion of the second polymer portion.

7. The method of claim 6, further comprising:
forming a peripheral circuit pattern having multiple circuit patterns coupled with the first portions, wherein a formation position of each circuit pattern is corrected using a position error based on the position of the first part.

8. The method of claim 4, wherein:
a frame pattern is formed on a predetermined area of the substrate, and the self-assembly material is formed inside the frame pattern; the method further comprising:
selectively removing the first part after separating the self-assembly material by a micro phase separation process; and
forming a connection pattern, which connects the peripheral circuit pattern and area where first part is removed to an area where the frame pattern is formed.

9. The method of claim 8, wherein the first polymer portion is hydrophobic and the second polymer portion is hydrophilic, and the frame pattern comprises a surface tension that is between the first polymer portion and the second polymer portion.

10. The method of claim 4, wherein:
a frame pattern is formed on a predetermined area of the substrate, and the self-assembly material is formed inside the frame pattern, the method further comprising:
selectively removing the first part after separating the self-assembly material by a micro phase separation process; and
forming a connection pattern, which connects a peripheral circuit pattern and area where first part is removed to an area where the frame pattern is formed.

11. The method of claim 10, wherein a resist is coated in the area where the frame pattern is formed; and
the resist is processed by lithographic exposure and development to form the connection pattern.

12. The method of claim 11, wherein the first polymer portion is hydrophobic and the second polymer portion is hydrophilic, and the frame pattern comprises a surface tension that is between the first polymer portion and the second polymer portion.

13. A method for forming a pattern, comprising:
forming a self-assembly material layer containing a first polymer portion and a second polymer portion on a substrate having a fiducial mark;
forming a first pattern in the self-assembly material layer by micro-phase separating the self-assembly material layer;

measuring a position error of the first pattern on the basis of the fiducial mark; and
forming a second pattern on the substrate based on the position error.

14. The method of claim 13, wherein the self-assembly material layer is heated to form the first pattern.

15. The method of claim 14, further comprising:
forming a frame pattern on the substrate, wherein a chemical guide layer is formed inside the frame pattern, and
the self-assembly material is formed on the chemical guide layer.

16. The method of claim 15, wherein the first polymer portion is hydrophobic and the second polymer portion is hydrophilic, and the frame pattern comprises a surface tension that is between the first polymer portion and the second polymer portion.

17. The method of claim 13, wherein the second pattern is a higher precision alignment mark for the first pattern.

18. A method for producing an original lithography mask comprising:
forming frame pattern surrounding a predetermined area on a masked substrate which has a fiducial mark and where a film is prepared on an upper surface thereof;
forming a self-assembly material containing a first segment as well as a second segment inside the frame pattern;
separating the self-assembly material in a micro phase and to form a self-assembled pattern containing a plurality of first portions comprising the first segment and a plurality of second portions containing the second segment;
measuring a position error, from a predetermined formation position of one of:
the self-assembled pattern,
the first part, or
the second part, on the basis of the fiducial mark;
forming a pattern for alignment and a peripheral circuit pattern on the substrate;
selectively removing the first portions; and
transferring the pattern for alignment, the peripheral circuit pattern and the pattern corresponding to the first portions, to the film;
wherein
at least one pattern selected from the group consisting of the pattern for alignment and the peripheral circuit pattern, is corrected using the position error.

19. The method of claim 18, further comprising:
forming a second self-assembly material containing a third segment and a fourth segment on the area where the frame pattern is formed; and
separating the second self-assembly material in the microphase to form a second self-assembled pattern containing a third part with the third segment and a fourth part with the fourth segment.

20. The method of claim 19, further comprising:
forming a connection pattern that connects the peripheral circuit pattern and the area where the first part is removed, by selectively removing the third part.

21. The method of claim 19, wherein a formation position of the pattern for alignment is corrected using a position error of the first self-assembled pattern, and a formation position of the peripheral circuit pattern using a position error of the first pattern.

* * * * *